(12) United States Patent
Huang et al.

(10) Patent No.: US 7,528,053 B2
(45) Date of Patent: May 5, 2009

(54) THREE-DIMENSIONAL PACKAGE AND METHOD OF MAKING THE SAME

(75) Inventors: Min-Lung Huang, Kaohsiung (TW);
Wei-Chung Wang, Kaohsiung (TW);
Po-Jen Cheng, Kaohsiung (TW);
Kuo-Chung Yee, Kaohsiung (TW);
Ching-Huei Su, Kaohsiung (TW);
Jian-Wen Lo, Kaohsiung (TW);
Chian-Chi Lin, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 223 days.

(21) Appl. No.: 11/645,042

(22) Filed: Dec. 26, 2006

(65) Prior Publication Data
US 2007/0172985 A1 Jul. 26, 2007

(30) Foreign Application Priority Data
Jan. 25, 2006 (TW) .............................. 95102835 A

(51) Int. Cl.
*H01L 21/46* (2006.01)
*H01L 21/4763* (2006.01)
(52) U.S. Cl. ................ 438/458; 438/638; 438/618; 438/459; 257/E21.705; 257/E21.597
(58) Field of Classification Search ................ 438/455, 438/458, 459, 618, 622, 638, 106, 109, 110, 438/113; 257/E21.597, E21.705
See application file for complete search history.

(56) References Cited

U.S. PATENT DOCUMENTS

| | | | |
|---|---|---|---|
| 3,761,782 A | 9/1973 | Youmans | |
| 4,394,712 A | 7/1983 | Anthony | |
| 4,499,655 A | 2/1985 | Anthony | |
| 4,807,021 A | 2/1989 | Okumura | |
| 4,842,699 A | 6/1989 | Hua et al. | |
| 4,897,708 A | 1/1990 | Clements | |
| 4,982,265 A | 1/1991 | Watanabe et al. | |
| 5,166,097 A | 11/1992 | Tanielian | |
| 5,191,405 A | 3/1993 | Tomita et al. | |
| 5,229,647 A | 7/1993 | Gnadinger | |

(Continued)

FOREIGN PATENT DOCUMENTS

JP 2002246540 A 8/2002

(Continued)

*Primary Examiner*—Alexander G Ghyka
*Assistant Examiner*—Seahvosh J Nikmanesh
(74) *Attorney, Agent, or Firm*—Volentine & Whitt, P.L.L.C.

(57) ABSTRACT

A three-dimensional package and a method of making the same including providing a wafer; forming at least one blind hole in the wafer; forming an isolation layer on the side wall of the blind hole; forming a conductive layer on the isolation layer; forming a dry film on the conductive layer; filling the blind hole with metal; removing the dry film, and patterning the conductive layer; removing a part of the metal in the blind hole to form a space; removing a part of the second surface of the wafer and a part of the isolation layer, to expose a part of the conductive layer; forming a solder on the lower end of the conductive layer, the melting point of the solder is lower than the metal; stacking a plurality of the wafers, and performing a reflow process; and cutting the stacked wafers, to form three-dimensional packages.

22 Claims, 10 Drawing Sheets

U.S. PATENT DOCUMENTS

| | | | |
|---|---|---|---|
| 5,239,448 A | 8/1993 | Perkins et al. | |
| 5,241,454 A | 8/1993 | Ameen et al. | |
| 5,266,912 A | 11/1993 | Kledzik | |
| 5,300,813 A | 4/1994 | Joshi et al. | |
| 5,380,681 A | 1/1995 | Hsu | |
| 5,399,898 A | 3/1995 | Rostoker | |
| 5,401,689 A | 3/1995 | Frei et al. | |
| 5,404,044 A | 4/1995 | Booth et al. | |
| 5,411,918 A | 5/1995 | Keible et al. | |
| 5,419,806 A | 5/1995 | Huebner | |
| 5,432,999 A | 7/1995 | Capps et al. | |
| 5,466,634 A | 11/1995 | Beilstein, Jr. et al. | |
| 5,481,133 A | 1/1996 | Hsu | |
| 5,510,655 A | 4/1996 | Tanielian | |
| 5,517,057 A | 5/1996 | Beilstein, Jr. et al. | |
| 5,561,622 A | 10/1996 | Bertin et al. | |
| 5,563,086 A | 10/1996 | Bertin et al. | |
| 5,567,654 A | 10/1996 | Beilstein, Jr. et al. | |
| 5,571,754 A | 11/1996 | Bertin et al. | |
| 5,608,264 A | 3/1997 | Gaul | |
| 5,618,752 A | 4/1997 | Gaul | |
| 5,627,106 A | 5/1997 | Hsu | |
| 5,637,912 A | 6/1997 | Cockerill et al. | |
| 5,675,180 A | 10/1997 | Pedersen et al. | |
| 5,682,062 A | 10/1997 | Gaul | |
| 5,699,234 A | 12/1997 | Saia et al. | |
| 5,767,001 A | 6/1998 | Bertagnolli et al. | |
| 5,837,566 A | 11/1998 | Pedersen et al. | |
| 5,872,025 A | 2/1999 | Cronin et al. | |
| 5,891,761 A | 4/1999 | Vindasius et al. | |
| 5,998,292 A | 12/1999 | Black et al. | |
| 6,124,149 A | 9/2000 | Paik et al. | |
| 6,146,992 A | 11/2000 | Lauterbach et al. | |
| 6,168,969 B1 | 1/2001 | Farnworth | |
| 6,177,296 B1 | 1/2001 | Vindasius et al. | |
| 6,187,677 B1 | 2/2001 | Ahn | |
| 6,221,769 B1 | 4/2001 | Dhong et al. | |
| 6,228,470 B1 | 5/2001 | Kresge et al. | |
| 6,313,517 B1 | 11/2001 | Lauterbach et al. | |
| 6,429,509 B1 | 8/2002 | Hsuan | |
| 6,451,624 B1 | 9/2002 | Farnworth et al. | |
| 6,451,626 B1 | 9/2002 | Lin | |
| 6,475,831 B2 | 11/2002 | Moden et al. | |
| 6,566,232 B1 | 5/2003 | Hara et al. | |
| 6,577,013 B1 | 6/2003 | Glenn et al. | |
| 6,583,030 B1 | 6/2003 | Grassl | |
| 6,642,081 B1 | 11/2003 | Patti | |
| 6,645,796 B2 | 11/2003 | Christensen et al. | |
| 6,645,832 B2 | 11/2003 | Kim et al. | |
| 6,667,551 B2 | 12/2003 | Hanaoka et al. | |
| 6,677,235 B1 | 1/2004 | Yegnashankaran et al. | |
| 6,693,361 B1 | 2/2004 | Siniaguine et al. | |
| 6,716,737 B2 | 4/2004 | Plas et al. | |
| 6,720,661 B2 | 4/2004 | Hanaoka et al. | |
| 6,723,577 B1 | 4/2004 | Geusic et al. | |
| 6,727,116 B2 | 4/2004 | Poo et al. | |
| 6,744,127 B2 | 6/2004 | Hedler et al. | |
| 6,756,681 B1 | 6/2004 | Hanawa | |
| 6,773,955 B2 | 8/2004 | Moden et al. | |
| 6,774,477 B2 | 8/2004 | Han | |
| 6,809,421 B1 | 10/2004 | Hayasaka et al. | |
| 6,812,549 B2 | 11/2004 | Umetsu et al. | |
| 6,828,175 B2 | 12/2004 | Wood et al. | |
| 6,838,310 B1 | 1/2005 | Hsuan | |
| 6,841,849 B2 | 1/2005 | Miyazawa | |
| 6,848,177 B2 | 2/2005 | Swan et al. | |
| 6,852,621 B2 | 2/2005 | Hanaoka et al. | |
| 6,853,085 B2 | 2/2005 | Kux et al. | |
| 6,894,386 B2 | 5/2005 | Poo et al. | |
| 6,903,442 B2 | 6/2005 | Wood et al. | |
| 6,908,845 B2 | 6/2005 | Swan et al. | |
| 7,102,219 B2 | 9/2006 | Hanaoka et al. | |
| 7,190,078 B2 * | 3/2007 | Khandekar et al. | 257/774 |
| 2004/0245623 A1 | 12/2004 | Hara et al. | |
| 2005/0136558 A1 * | 6/2005 | Wang et al. | 438/5 |
| 2005/0224921 A1 * | 10/2005 | Gupta et al. | 257/621 |
| 2006/0138629 A1 | 6/2006 | Fukazawa | |

FOREIGN PATENT DOCUMENTS

| | | |
|---|---|---|
| TW | I227910 | 2/2005 |

* cited by examiner

THREE-DIMENSIONAL PACKAGE AND METHOD OF MAKING THE SAME

BACKGROUND OF THE INVENTION

1. Field of the Invention

The present invention relates to a package and a method of making the same, and more particularly to a three-dimensional package and a method of making the same.

2. Description of the Related Art

Referring to FIG. 1, it shows a schematic view of a three-dimensional package before reflow disclosed in U.S. Pat. No. 4,499,655. The conventional three-dimensional package 1 comprises a first unit 10 and a second unit 20. The first unit 10 comprises a first wafer 11, at least one first hole 12, a first conductive layer 13 and a first solder 14. The first wafer 11 has a first surface 111 and a second surface 112. The first surface 111 has at least one first pad (not shown) and a first protection layer 113 exposing the first pad. The first hole 12 penetrates the first wafer 11. The first conductive layer 13 is disposed on the side wall of the first hole 12 and covers the first pad and the first protection layer 113. The first solder 14 is disposed in the first hole 12 and is electrically connected to the first pad via the first conductive layer 13. The upper end of the first solder 14 extends above the first surface 111 of the first wafer 11, and the lower end extends below the second surface 112 of the first wafer 11.

The second unit 20 is stacked on the first unit 10. The second unit 20 comprises a second wafer 21, at least one second hole 22, a second conductive layer 23 and a second solder 24. The second wafer 21 has a first surface 211 and a second surface 212. The first surface 211 has at least one second pad (not shown) and a second protection layer 213 exposing the second pad. The second hole 22 penetrates the second wafer 21. The second conductive layer 23 is disposed on the side wall of the second hole 22 and covers the second pad and the second protection layer 213. The second solder 24 is disposed in the second hole 22 and is electrically connected to the second pad via the second conductive layer 23. The upper end of the second solder 24 extends above the first surface 211 of the second wafer 21, and the lower end of the second solder 24 extends below the second surface 212 of the second wafer 21. The lower end of the second solder 24 is aligned with and contacts the upper end of the first solder 14. After performing a reflow process, the first unit 10 and the second unit 20 are joined to form a conventional three-dimensional package 1, as shown in FIG. 2.

In the conventional three-dimensional package 1, the first solder 14 and the second solder 24 are formed by disposing the first wafer 11 and the second wafer 21 above a solder bath, and the solder enters the first hole 12 and the second hole 22 according to the capillary phenomenon so as to form the first solder 14 and the second solder 24.

The disadvantages of the conventional three-dimensional package 1 are described as follows. As the first solder 14 and the second solder 24 are formed according to the capillary phenomenon, the upper and the lower ends of the foregoing solders are in a hemispherical shape (FIG. 1). As such, when the first unit 10 and the second unit 20 are aligned and joined, alignment becomes more difficult and the joining between the first unit 10 and the second unit 20 after reflow is not stable. Moreover, after the joining of the first unit 10 and the second unit 20, the overall height cannot be effectively reduced due to the excess hemispherical solders.

Therefore, it is necessary to provide a three-dimensional package and a method of making the same to solve the above problems.

SUMMARY OF THE INVENTION

The main objective of the invention is to provide a method of making a three-dimensional package, which comprises the following steps:

(a) providing a wafer, having a first surface and a second surface, the first surface having at least one pad and a protection layer exposing the pad;

(b) forming at least one blind hole on the first surface of the wafer;

(c) forming an isolation layer on the side wall of the blind hole;

(d) forming a conductive layer covering the pad, the protection layer and the isolation layer;

(e) forming a dry film on the conductive layer, wherein the dry film has an opening at the position corresponding to the blind hole;

(f) filling the blind hole with a metal;

(g) removing the dry film and patterning the conductive layer;

(h) removing a part of the metal in the blind hole to form a space;

(i) removing a part of the second surface of the wafer and a part of the isolation layer, so as to expose a part of the conductive layer;

(j) forming a solder on the lower end of the conductive layer, wherein the melting point of the solder is lower than that of the metal;

(k) stacking a plurality of the wafers, and performing a reflow process; and (l) cutting the stacked wafers, so as to form a plurality of three-dimensional packages.

As such, the lower end of the conductive layer is exposed below the second surface of the wafer. Therefore, during the reflow process after stacking, the lower end of the conductive layer and the solder thereon are inserted into the space of the lower wafer, so as to enhance the joint between the conductive layer and the solder, and effectively reduce the overall height of the three-dimensional package after joining.

Another objective of the present invention is to provide a three-dimensional package structure, which has a first unit and a second unit. The first unit comprises a first wafer, at least one first hole, a first isolation layer, a first conductive layer, a first metal and a first solder.

The first wafer has a first surface and a second surface. The first surface has at least one first pad and a first protection layer exposing the first pad. The first hole penetrates the first wafer. The first isolation layer is disposed on the side wall of the first hole. The first conductive layer covers the first pad, a part of the first protection layer, and the first isolation layer. The lower end of the first conductive layer extends below the second surface of the first wafer. The first metal is disposed in the first hole, and is electrically connected to the first pad via the first conductive layer. The first solder is disposed on the first metal in the first hole, wherein the melting point of the first solder is lower than that of the first metal.

The second unit is stacked on the first unit. The second unit comprises a second wafer, at least one second hole, a second isolation layer, a second conductive layer, a second metal and a second space. The second wafer has a first surface and a second surface. The first surface has at least one second pad and a second protection layer exposing the second pad. The second hole penetrates the second wafer. The second isolation layer is disposed on the side wall of the second hole.

The second conductive layer covers the second pad, a part of the second protection layer and the second isolation layer. The lower end of the second conductive layer extends below the second surface of the second wafer and contacts the upper end of the first solder. The second metal is disposed in the second hole and is electrically connected to the second pad via the second conductive layer. The second space is disposed on the second metal in the second hole.

DETAILED DESCRIPTION OF THE INVENTION

Figure 1:
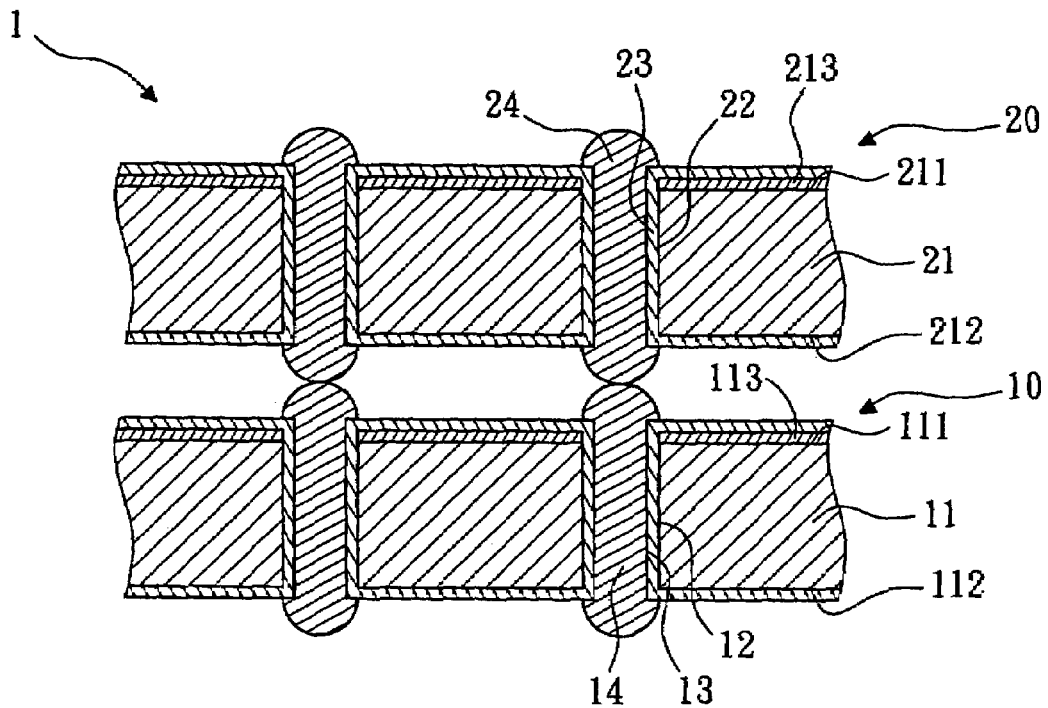
FIG. 1 shows a schematic view of the three-dimensional package before reflow disclosed in U.S. Pat. No. 4,499,655.
Figure 2:
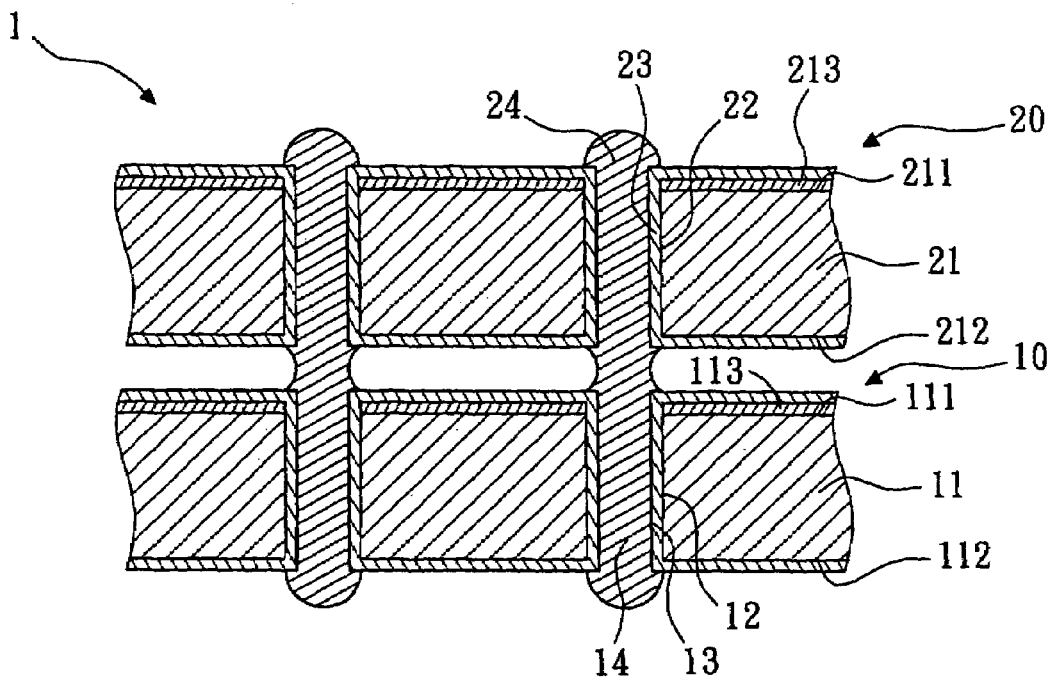
FIG. 2 shows a schematic view of the three-dimensional package after reflow disclosed in U.S. Pat. No. 4,499,655.
Figure 3:
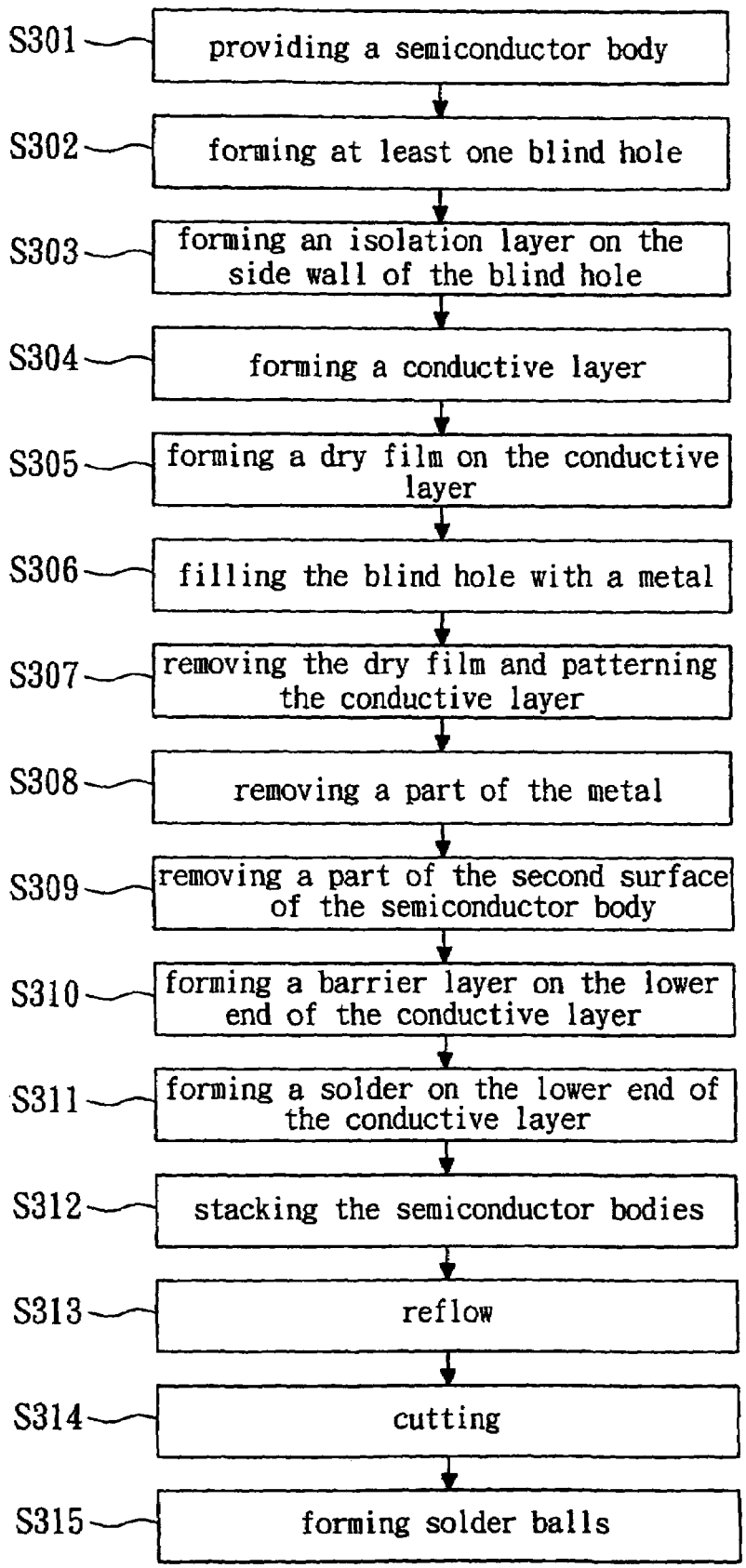
FIG. 3 shows a schematic flow chart of the method for making a three-dimensional package according to the first embodiment of the present invention.
Figure 4:
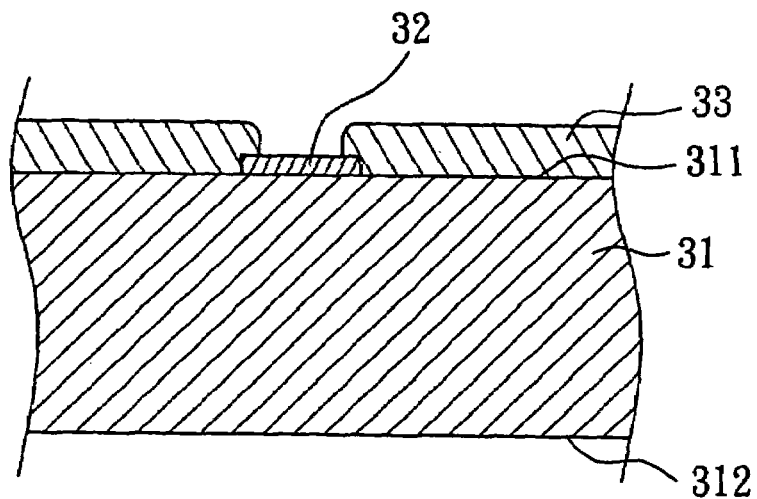
FIGS. 4 to 17 show the schematic views of each step of the method for making a three-dimensional package according to the first embodiment of the present invention.

Referring to FIG. 3, it shows a schematic flow chart of the method for making a three-dimensional package according to the first embodiment of the present invention. Referring to FIGS. 4 to 17, the schematic views of each step of the method for making a three-dimensional package according to the first embodiment of the present invention are shown. First, referring to FIGS. 3 and 4, as shown in step S301, a wafer 31 is provided. The wafer 31 has a first surface 311 and a second surface 312. The first surface 311 has at least one pad 32 and a protection layer 33 exposing the pad 32.

Figure 5:
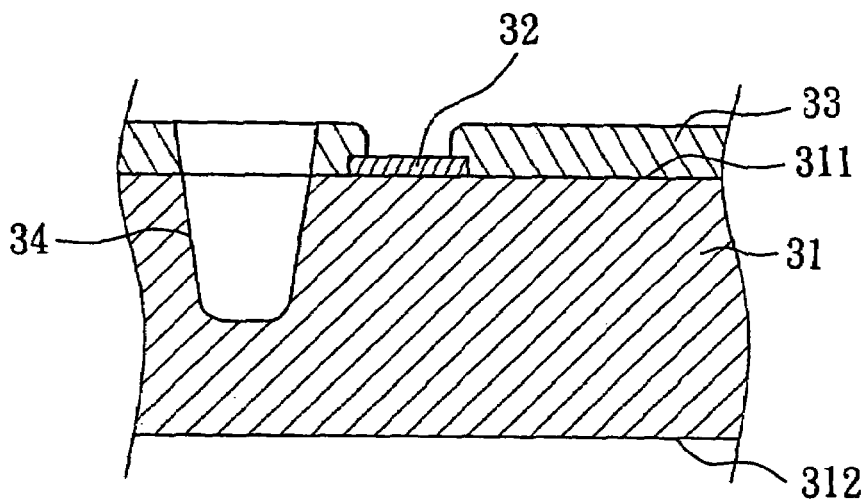

Then, referring to FIGS. 3 and 5, as shown in step S302, at least one blind hole 34 is formed in the first surface 311 of the wafer 31. In the present embodiment, the blind hole 34 is disposed beside the pad 32. However, in other applications, the blind hole 34 can penetrate the pad 32.

Figure 6:
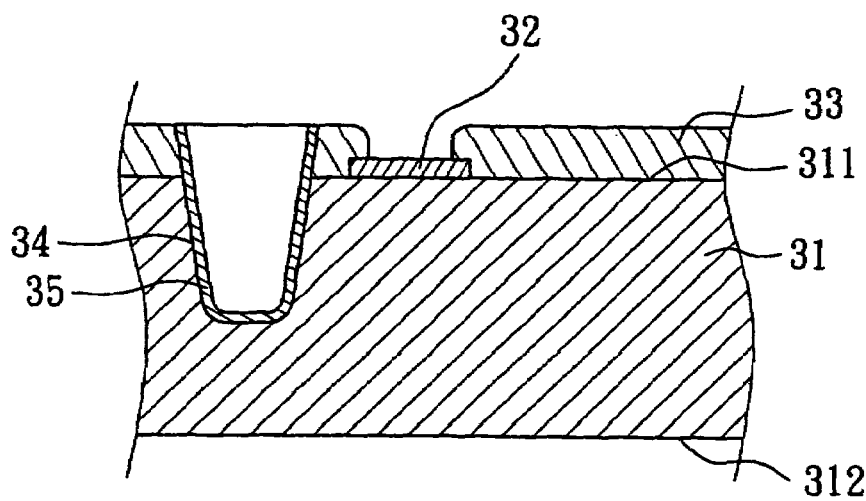

Next, referring to FIGS. 3 and 6, as shown in step S303, an isolation layer 35 is formed on the side wall of the blind hole 34.

Figure 7:
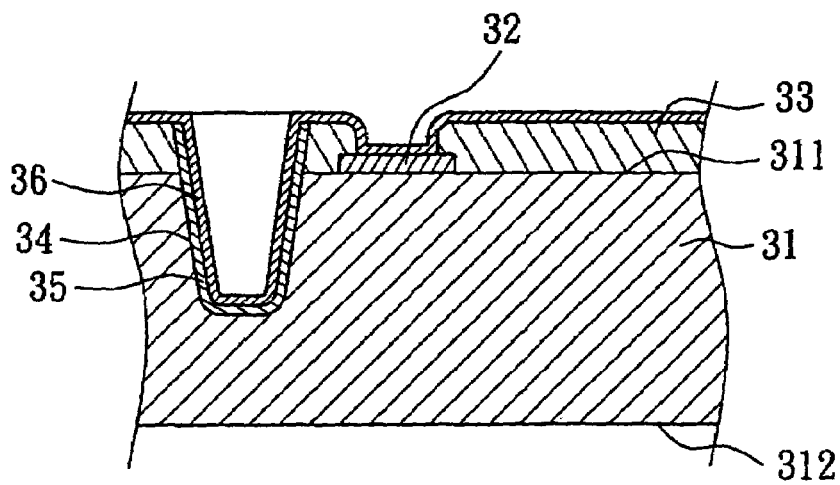

Afterward, referring to FIGS. 3 and 7, as shown in step S304, a conductive layer 36 is formed to cover the pad 32, the protection layer 33, and the isolation layer 35. The conductive layer 36 is made of Ti, Cu, Cu/Ti alloy, or other metals.

Figure 8:
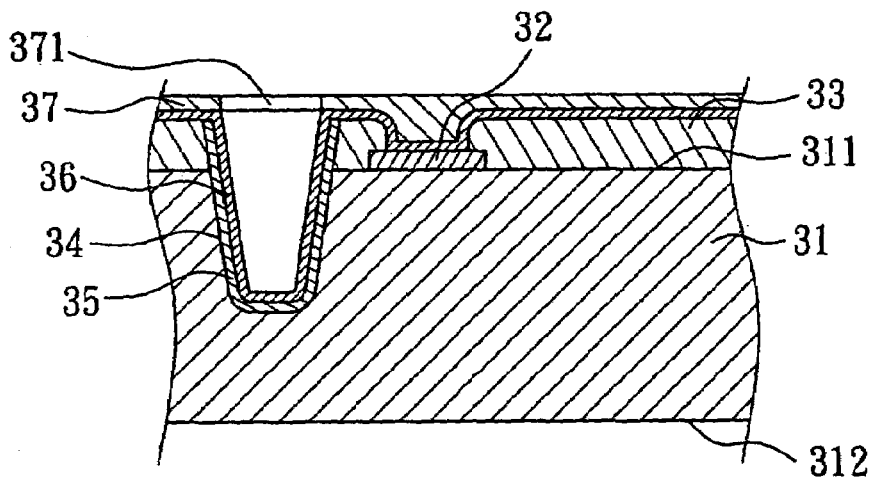

Then, referring to FIGS. 3 and 8, as shown in step S305, a dry film 37 is formed on the conductive layer 36. The dry film 37 has an opening 371 at the position corresponding to the blind hole 34.

Figure 9:
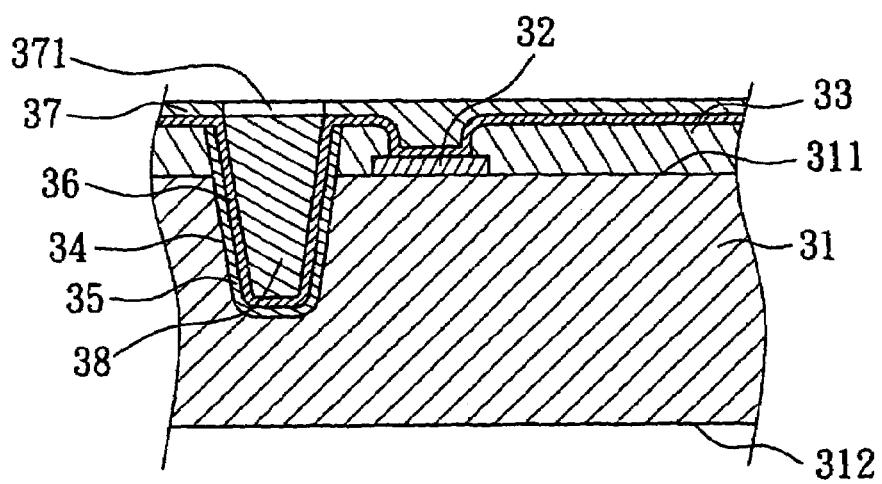

After that, referring to FIGS. 3 and 9, as shown in step S306, the blind hole 34 is filled with a metal 38 (e.g., copper). In the present embodiment, the blind hole 34 is filled with the metal 38 by plating. However, it should be understood that the blind hole 34 can be filled with the metal 38 by other manners.

Figure 10:
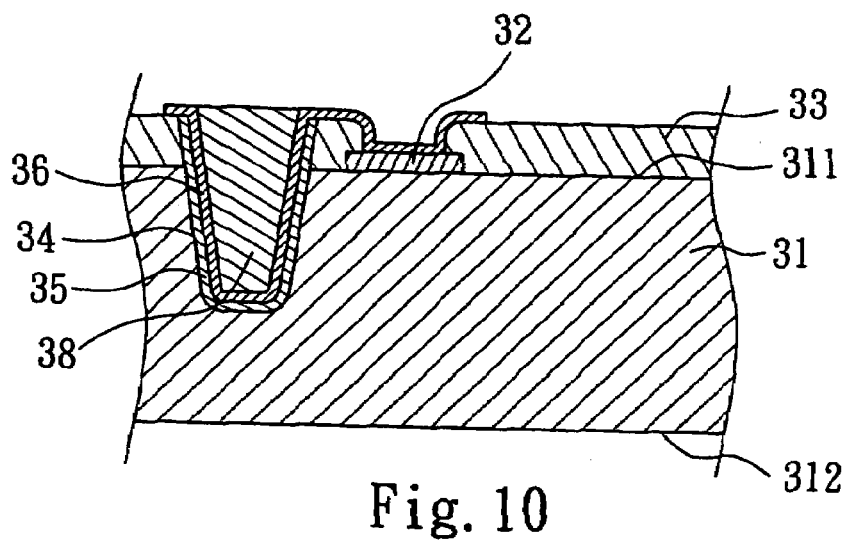

Then, referring to FIGS. 3 and 10, as shown in step S307, the dry film 37 is removed, and the conductive layer 36 is patterned.

Figure 11:
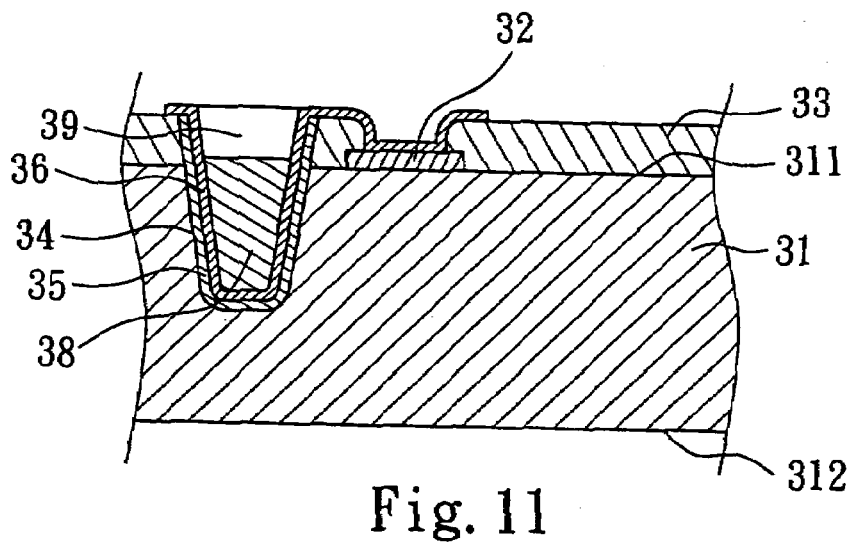

Afterward, referring to FIGS. 3 and 11, as shown in step S308, a part of the upper end of the metal 38 in the blind hole 34 is removed, so as to form a space 39. In the embodiment, a part of the upper end of the metal 38 in the blind hole 34 is removed by etching. It should be understood that a part of the upper end of the metal 38 in the blind hole 34 is can be removed by other manners.

Figure 12:
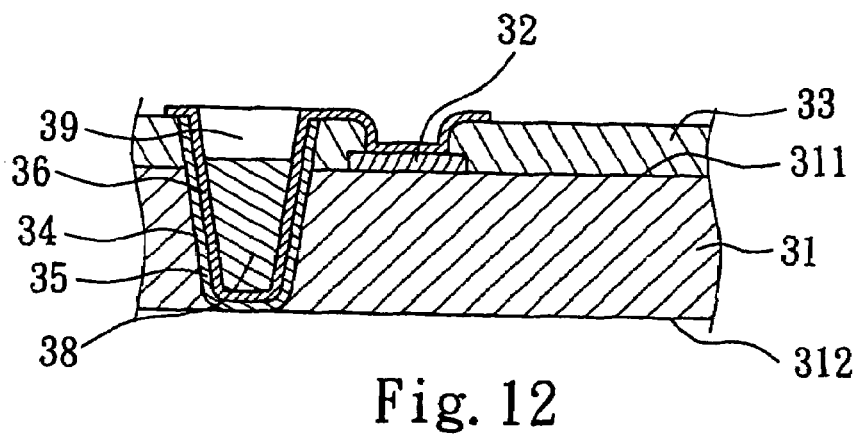
Figure 13:
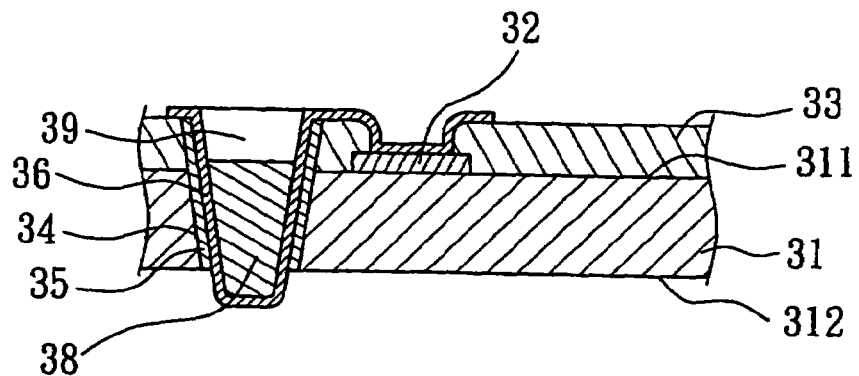

Then, as shown in step S309, a part of the second surface 312 of the wafer 31 and a part of the isolation layer 35 are removed to expose a part of the conductive layer 36. Referring to FIG. 12, in the present embodiment, the second surface 312 of the wafer 31 is ground by means of backside grinding until the second surface 312 and the lower end of the isolation layer 35 are at the same level, i.e., the lower end of the isolation layer 35 is exposed on the second surface 312. Then, the second surface 312 of the wafer 31 and the lower end of the isolation layer 35 are etched to expose the lower end of the conductive layer 36. At this moment, the lower end of the conductive layer 36 extends below the second surface 312 of the wafer 31, as shown in FIG. 13. However, it should be understood that in other applications, the second surface 312 of the wafer 31 can be directly etched to expose the lower end of the conductive layer 36, without using the backside grinding method.

Figure 14:
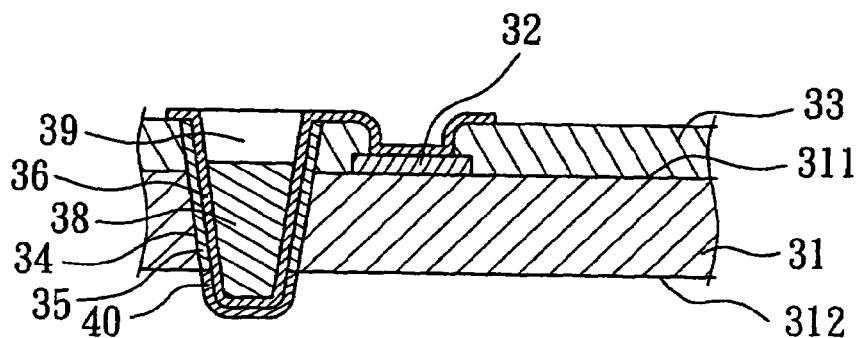

Afterward, referring to FIGS. 3 and 14, preferably, as shown in step S310, a barrier layer 40 is formed on the lower end of the conductive layer 36, and covers the lower end of the exposed conductive layer 36. The barrier layer 40 is Ni, Cr, Cr/Cu alloy, or other metals. It should be understood that this step is optional.

Figure 15:
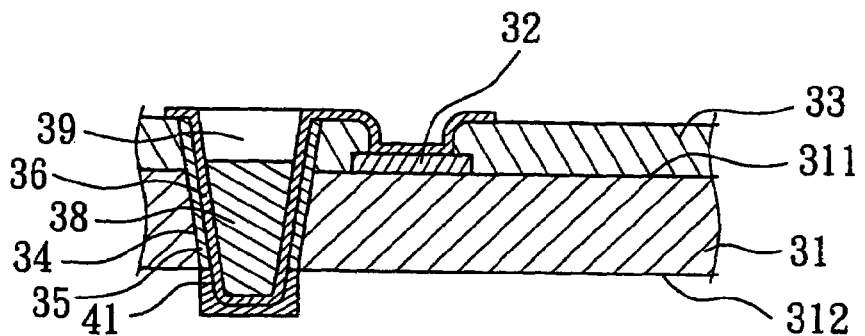

Next, referring to FIGS. 3 and 15, as shown in step S311, a solder 41 is formed on the lower end of the conductive layer 36. The material of the solder 41 is different from the metal 38. The material of the solder 41 includes but is not limited to Sn/Pb alloy, and the melting point thereof is lower than that of the metal 38. The solder 41 is attached to the barrier layer 40 or the lower end of the exposed conductive layer 36.

Figure 16:
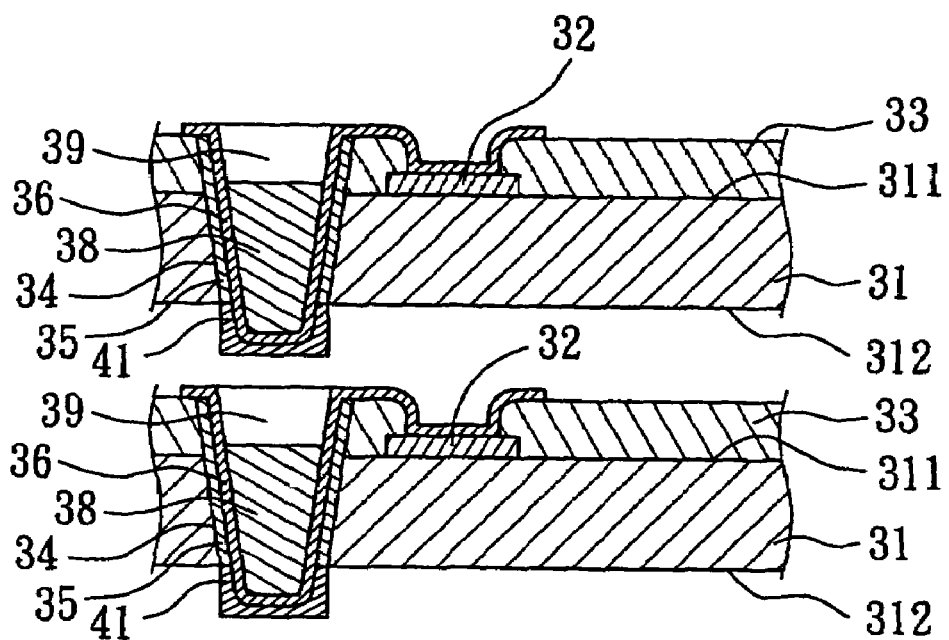

Then, referring to FIGS. 3 and 16, as shown in step S312, a plurality of the wafers 31 are stacked. The solder 41 of the upper wafer 31 is aligned to the space 39 of the conductive layer 36 of the lower wafer 31.

Figure 17:
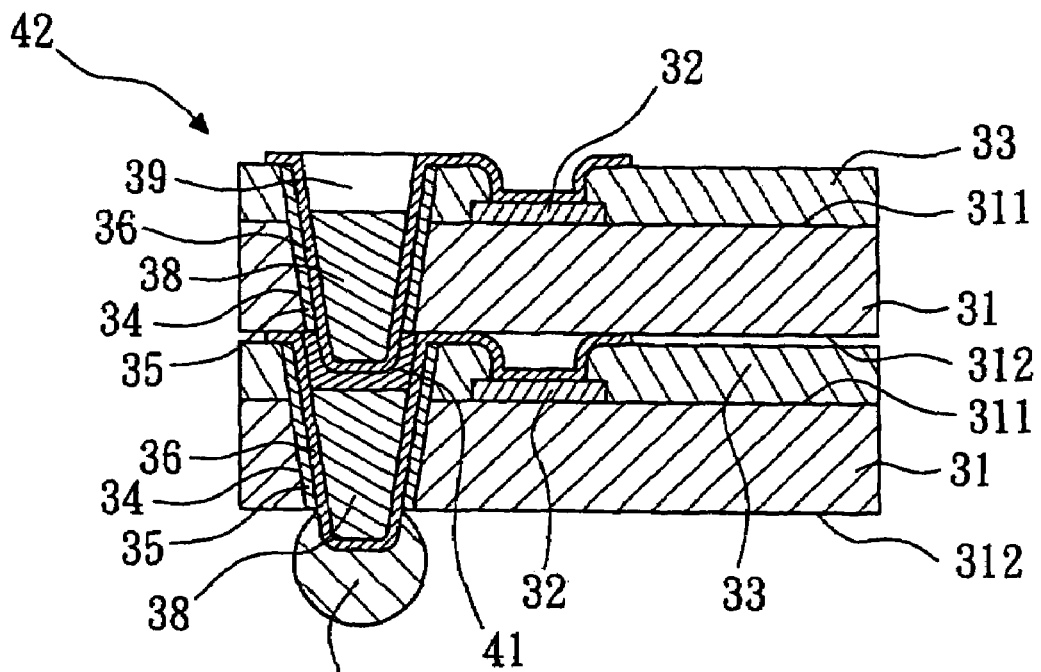

Finally, referring to FIGS. 3 and 17, as shown in step S313, the reflow process is performed to make the wafers 31 joined by welding the conductive layer 36, the solder 41 and the metal 38. Finally, as shown in step S314, the stacked wafer 31 is cut to form a plurality of three-dimensional package structures 42. Preferably, as shown in step S315, at least one solder ball 43 is formed below the three-dimensional package structure 42. The solder ball 43 is disposed on the lower end of the conductive layer 36 in the lower wafer 31. It should be understood that this step is optional.

Figure 18:
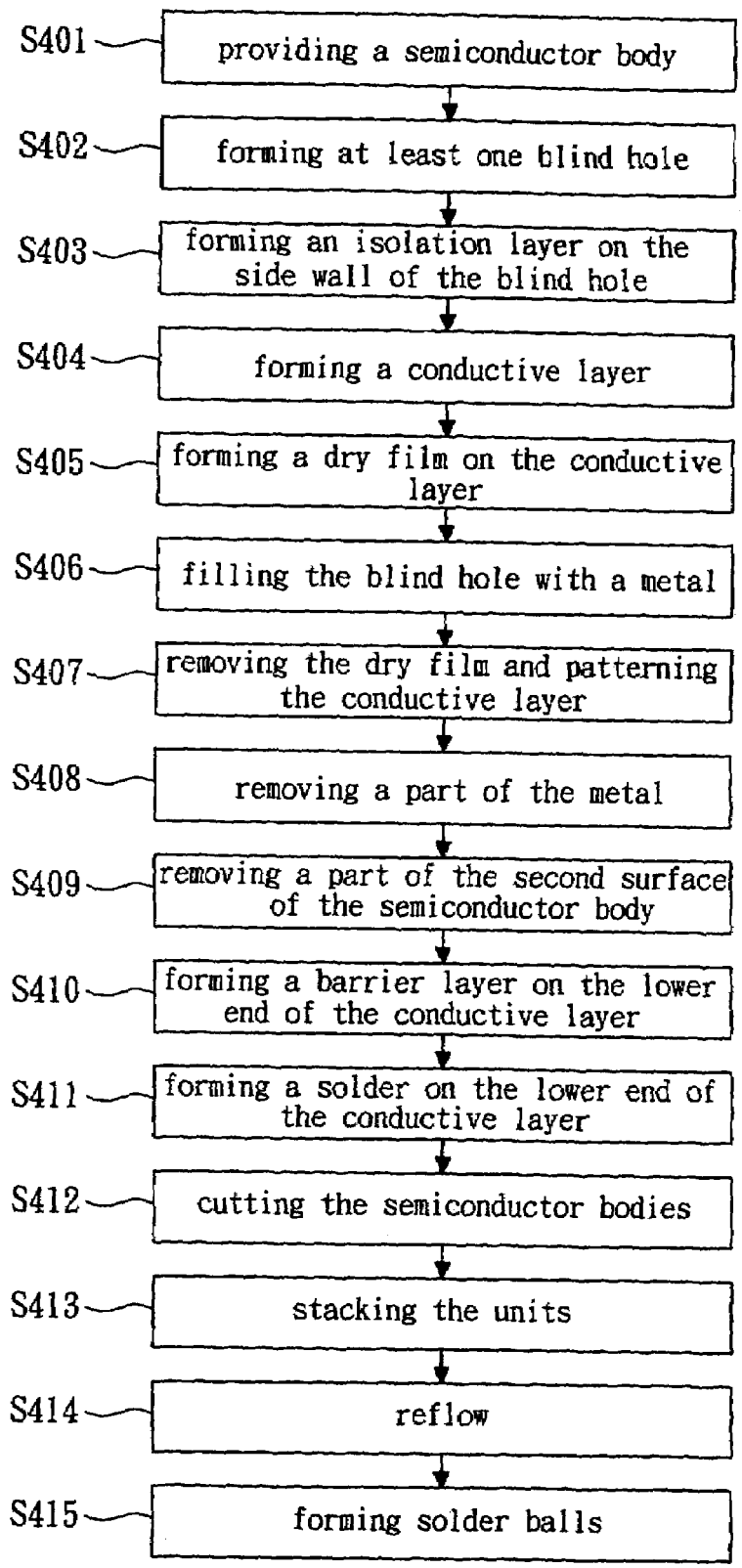
FIG. 18 shows a schematic flow chart of the method for making a three-dimensional package according to the second embodiment of the present invention.
Figure 19:
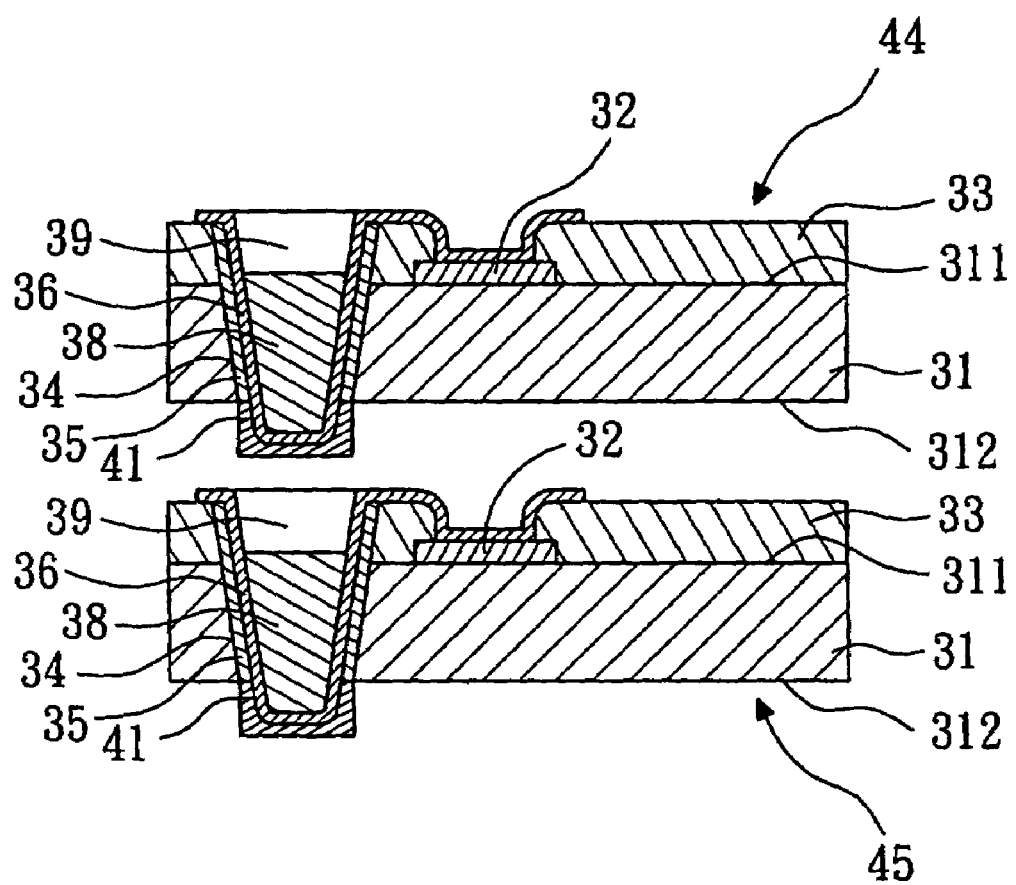
FIGS. 19 to 20 show the schematic views of a part of the steps of the method for making a three-dimensional package according to the second embodiment of the present invention.
Figure 20:
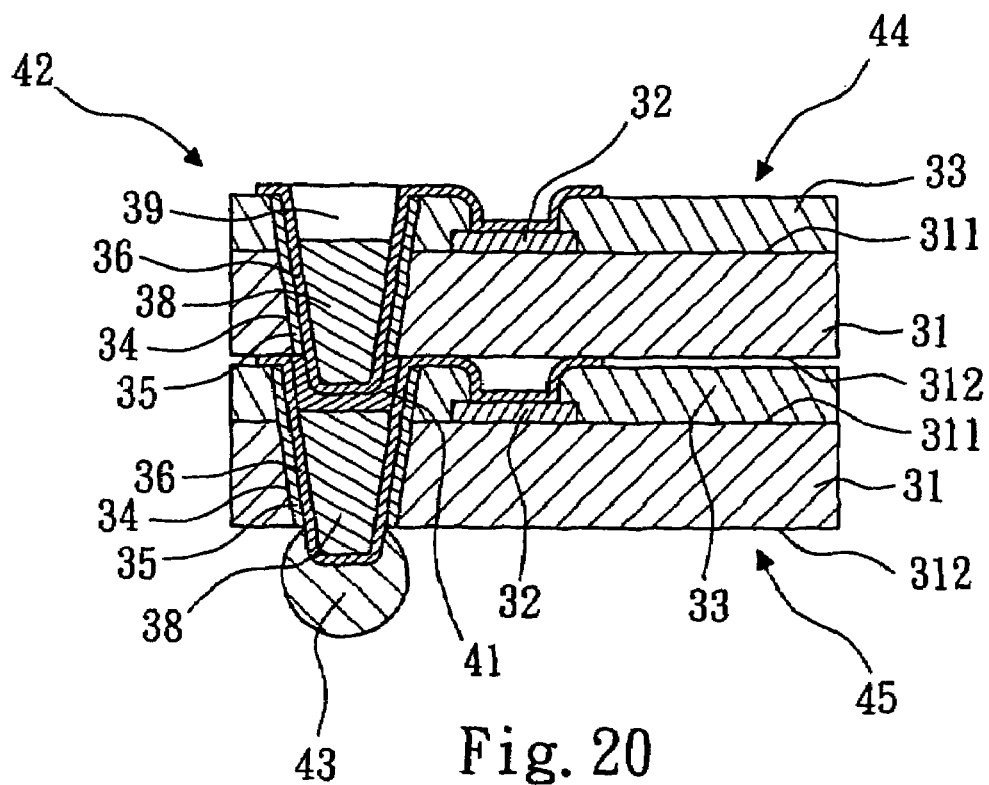

Referring to FIG. 18, it shows a schematic flow chart of the method for making a three-dimensional package structure according to the second embodiment of the present invention. The steps S401 to S411 are identical to steps S301 to S311 of the first embodiment. The difference between this embodiment and the first embodiment is described as follows. Referring to FIGS. 18 and 19, as shown in step S412, the wafer 31 is cut to form a plurality of units 44, 45. Then, in step S413 the units 44, 45 are stacked, wherein the solder 41 of the upper unit 44 is aligned with the space 39 of the conductive layer 36 of the lower unit 45. Finally, in step S414 the reflow process is performed to form a plurality of three-dimensional package structures 42, as shown in FIG. 20. The three-dimensional package structure 42 (FIG. 20) made according to this embodiment is identical to the three-dimensional package structure 42 (FIG. 17) made according to the first embodiment.

Preferably, in the step S415, at least one solder ball 43 is formed below the three-dimensional package structure 42.

The solder ball 43 is disposed on the lower end of the conductive layer 36 in the lower wafer 31. It should be understood that this step is optional.

Figure 21:
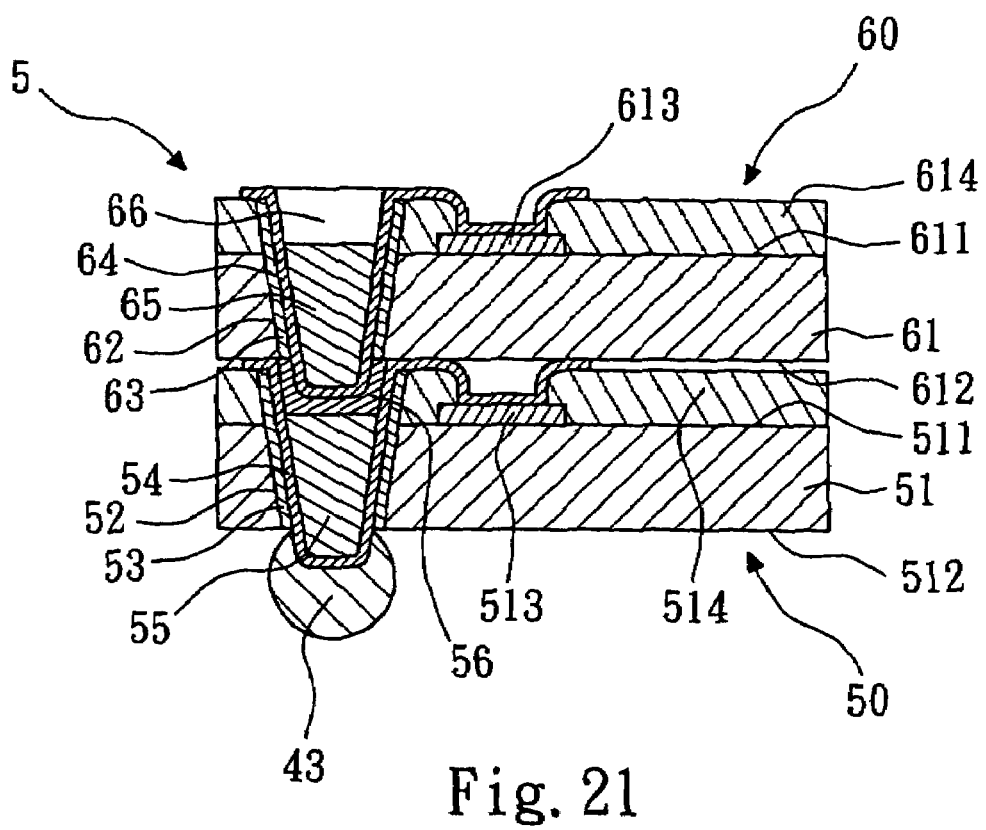
FIG. 21 shows a cross-sectional view of the three-dimensional package according to the present invention.

Referring to FIG. 21, it shows a cross-sectional view of the three-dimensional package structure according to the present invention. The three-dimensional package structure 5 in this figure is identical to the three-dimensional package structure 42 in FIGS. 17 and 20. However, for the convenience of illustration, the identical elements are identified by different reference numbers. The three-dimensional package structure 5 comprises a first unit 50 and a second unit 60. The first unit 50 comprises a first wafer 51, at least one first hole 52, a first isolation layer 53, a first conductive layer 54, a first metal 55 and a first solder 56.

The first wafer 51 is a wafer or a chip, and has a first surface 511 and a second surface 512. The first surface 511 has at least one first pad 513 and a first protection layer 514 exposing the first pad 513. The first hole 52 penetrates the first wafer 51. In the present embodiment, the first hole 52 is disposed beside the first pad 513. Alternatively, the first hole 52 can penetrate the first pad 513.

The first isolation layer 53 is disposed on the side wall of the first hole 52. The first conductive layer 54 covers the first pad 513, a part of the first protection layer 514 and the first isolation layer 53. The lower end of the first conductive layer 54 extends below the lower end of the second surface 512 of the first wafer 51. Preferably, the first unit 50 further comprises a first barrier layer (not shown) covering the lower end of the first conductive layer 54.

The first metal 55 (e.g., copper) is disposed in the first hole 52 and is electrically connected to the first pad 513 via the first conductive layer 54. The first solder 56 is disposed on the first metal 55 in the first hole 52. The material of the first solder 56 is different from the first metal 55. The material of the first solder 56 includes but is not limited to Sn/Pb alloy, and the melting point thereof is lower than that of the first metal 55.

The second unit 60 is stacked above the first unit 50. The second unit 60 comprises a second wafer 61, at least one second hole 62, a second isolation layer 63, a second conductive layer 64, a second metal 65 and a second space 66. The second wafer 61 is a wafer or a chip with a first surface 611 and a second surface 612. The first surface 611 has at least one second pad 613 and a second protection layer 614 exposing the second pad 613. The second hole 62 penetrates the second wafer 61. In the present embodiment, the second hole 62 is disposed beside the second pad 613. However, in other applications, the second hole 62 can penetrate the second pad 613.

The second isolation layer 63 is disposed on the side wall of the second hole 62. The second conductive layer 64 covers the second pad 613, a part of the second protection layer 614, and the second isolation layer 63. The lower end of the second conductive layer 64 extends below the second surface 612 of the second wafer 61 and contacts the upper end of the first solder 56. Preferably, the second unit 60 further comprises a second barrier layer (not shown) covering the lower end of the second conductive layer 64.

The second metal 65 is disposed in the second hole 62 and is electrically connected to the second pad 613 via the second conductive layer 64. The second space 66 is disposed above the second metal 65. Moreover, if desired, the second space 66 of the second hole 62 is filled with a second solder (not shown). Preferably, the three-dimensional package structure 5 further comprises at least one solder ball 43 disposed on the lower end of the first conductive layer 54.

In the three-dimensional package structure 5, the lower end of the second conductive layer 64 is exposed below the second surface 612 of the second unit 60. Therefore, during the reflow process, the lower end of the second conductive layer 64 and the solder thereon are "inserted" into the space on the first metal 55, so as to enhance the joint between the second conductive layer 64 and the first metal 55. Further, the first hole 52 and the second hole 62 can be designed as a taper shape to enhance the joining. Moreover, the lower end of the second conductive layer 64 is inserted into the space on the first metal 55, so the overall height of the three-dimensional package structure 5 after joining can be effectively reduced.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A method of making a three-dimensional package, comprising the following steps:
   (a) providing a wafer, having a first surface and a second surface, the first surface having at least one pad and a protection layer exposing the pad;
   (b) forming at least one blind hole on the first surface of the wafer;
   (c) forming an isolation layer on the side wall of the blind hole;
   (d) forming a conductive layer covering the pad, the protection layer, and the isolation layer;
   (e) forming a dry film on the conductive layer, wherein the dry film has an opening at the position corresponding to the blind hole;
   (f) filling the blind hole with a metal;
   (g) removing the dry film, and patterning the conductive layer;
   (h) removing a part of the metal in the blind hole, so as to form a space;
   (i) removing a part of the second surface of the wafer and a part of the isolation layer, so as to expose a part of the conductive layer;
   (j) forming a solder on the lower end of the conductive layer, wherein the melting point of the solder is lower than that of the metal;
   (k) stacking a plurality of the wafers, and performing a reflow process; and
   (l) cutting the stacked wafers, so as to form a plurality of three-dimensional package structures.

2. The method according to claim 1, wherein the blind hole is disposed beside the pad.

3. The method according to claim 1, wherein the blind hole penetrates the pad.

4. The method according to claim 1, wherein in the step (f) the blind hole is filled with the solder by plating.

5. The method according to claim 1, wherein the step (h) is etching a part of the metal in the blind hole, so as to form a space.

6. The method according to claim 1, wherein in the step (i) a part of the second surface of the wafer and a part of the isolation layer are etched, so as to expose a part of the conductive layer.

7. The method according to claim 1, wherein the step (i) comprises:
   (i1) grinding the second surface of the wafer; and
   (i2) etching a part of the second surface of the wafer and a part of the isolation layer, so as to expose a part of the conductive layer.

8. The method according to claim 1, further comprising a step of forming a barrier layer covering the exposed conductive layer after the step (i).

9. The method according to claim 1, wherein in the step (j), the solder is connected to the exposed conductive layer.

10. The method according to claim 1, wherein in the step (k), the solder of the upper wafer is aligned with the space of the lower wafer.

11. The method according to claim 1, further comprising a step of forming at least one solder ball below the three-dimensional package structure after the step (l).

12. A method of making a three-dimensional package, comprising the following steps:
 (a) providing a wafer, having a first surface and a second surface, the first surface having at least one pad and a protection layer exposing the pad;
 (b) forming at least one blind hole on the first surface of the wafer;
 (c) forming an isolation layer on the side wall of the blind hole;
 (d) forming a conductive layer covering the pad, the protection layer, and the isolation layer;
 (e) forming a dry film on the conductive layer, wherein the dry film has an opening at the position corresponding to the blind hole;
 (f) filling the blind hole with a metal;
 (g) removing the dry film, and patterning the conductive layer;
 (h) removing a part of the metal in the blind hole, so as to form a space;
 (i) removing a part of the second surface of the wafer and a part of the isolation layer, so as to expose a part of the conductive layer;
 (j) forming a solder on the lower end of the conductive layer, wherein the melting point of the solder is lower than that of the metal;
 (k) cutting the wafer to form a plurality of units; and
 (l) stacking a plurality of the units, and performing a reflow process, so as to form a plurality of three-dimensional package structures.

13. The method according to claim 12, wherein the blind hole is disposed beside the pad.

14. The method according to claim 12, wherein the blind hole penetrates the pad.

15. The method according to claim 12, wherein in the step (f) the blind hole is filled with the solder by plating.

16. The method according to claim 12, wherein in the step (h) a part of the metal in the blind hole is etched, so as to form a space.

17. The method according to claim 12, wherein in the step (i) a part of the second surface of the wafer and a part of the isolation layer are etched, so as to expose a part of the conductive layer.

18. The method according to claim 12, wherein the step (i) comprises:
 (i1) grinding the second surface of the wafer; and
 (i2) etching a part of the second surface of the wafer and a part of the isolation layer, so as to expose a part of the conductive layer.

19. The method according to claim 12, further comprising a step of forming a barrier layer covering the exposed conductive layer after the step (i).

20. The method according to claim 12, wherein in the step (j), the solder is connected to the exposed conductive layer.

21. The method according to claim 12, wherein in the step (l), the solder of the upper unit is aligned with the space of the lower unit.

22. The method according to claim 12, further comprising a step of forming at least one solder ball below the three-dimensional package structure after the step (l).

* * * * *